(12) United States Patent
Hickman

(10) Patent No.: US 8,035,379 B2
(45) Date of Patent: Oct. 11, 2011

(54) COIL ENERGIZATION APPARATUS AND METHOD OF ENERGIZING A SUPERCONDUCTIVE COIL

(75) Inventor: Kevin Jonathan Hickman, Oxon (GB)

(73) Assignee: Siemens PLC (GB)

( * ) Notice: Subject to any disclaimer, the term of this patent is extended or adjusted under 35 U.S.C. 154(b) by 258 days.

(21) Appl. No.: 12/389,556

(22) Filed: Feb. 20, 2009

(65) Prior Publication Data

US 2009/0212891 A1  Aug. 27, 2009

(30) Foreign Application Priority Data

Feb. 22, 2008 (GB) .................................. 0803253.4

(51) Int. Cl.
*G01V 3/00* (2006.01)
(52) U.S. Cl. ........................................ 324/307; 324/319
(58) Field of Classification Search ........... 324/300–322
See application file for complete search history.

(56) References Cited

U.S. PATENT DOCUMENTS

| 4,872,314 | A | | 10/1989 | Asano et al. |
| 5,021,914 | A | * | 6/1991 | Tsurunaga et al. ............. 361/19 |
| 5,051,627 | A | * | 9/1991 | Schneier et al. ................. 326/4 |
| 5,191,236 | A | * | 3/1993 | Ruby ............................ 327/528 |
| 5,233,244 | A | * | 8/1993 | Suzuki ............................. 326/4 |
| 5,475,560 | A | * | 12/1995 | Onishi et al. .................. 361/141 |
| 5,683,059 | A | | 11/1997 | Hara et al. |

FOREIGN PATENT DOCUMENTS

| JP | 59027583 | 2/1984 |
| JP | 60175403 | 9/1985 |
| JP | 09182265 | 7/1997 |
| JP | 2004304879 | 10/2004 |

* cited by examiner

*Primary Examiner* — Dixomara Vargas
(74) *Attorney, Agent, or Firm* — Schiff Hardin LLP

(57) ABSTRACT

A coil energizing apparatus has a superconducting energization power supply having an output port. The power supply is arranged to generate, when in use, a pulsed output current signal at the output port.

8 Claims, 3 Drawing Sheets

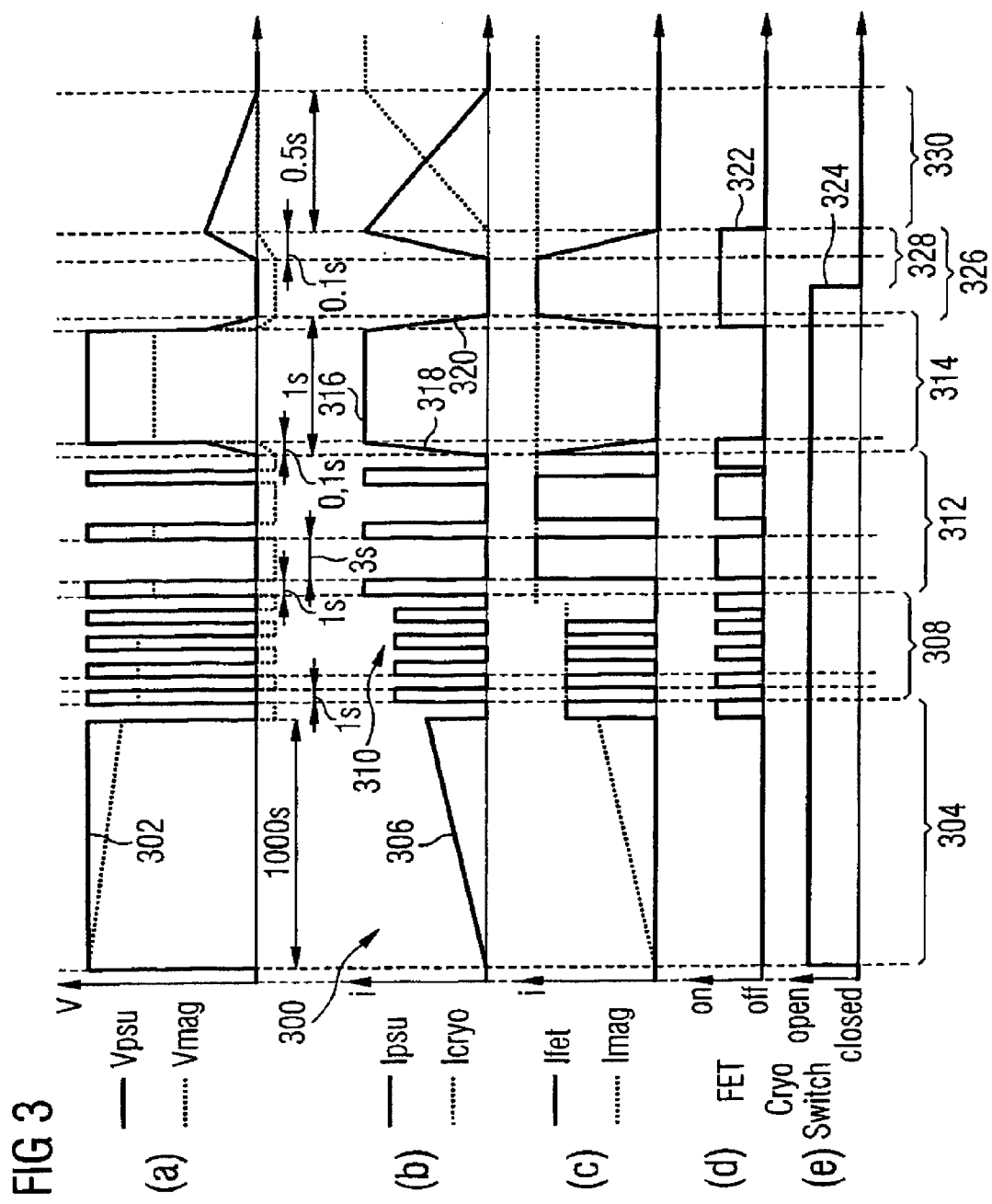

COIL ENERGIZATION APPARATUS AND METHOD OF ENERGIZING A SUPERCONDUCTIVE COIL

BACKGROUND OF THE INVENTION

1. Field of the Invention

The present invention relates to a coil energization apparatus of the type that, for example, is used to provide a superconductive coil with electrical current in order to achieve generation of a magnetic field, such as a static magnetic field. The present invention also relates to a method of energizing a superconductive coil of the type that, for example, is used to provide the superconductive coil with electrical current in order to achieve generation of a magnetic field, such as a static magnetic field.

2. Description of the Prior Art

In the field of nuclear Magnetic Resonance Imaging (MRI), a magnetic resonance imaging system typically comprises a superconducting magnet, a gradient coil system, field coils, shim coils and a patient table. The superconducting magnet is provided in order to generate a strong uniform static magnetic field, known as the $B_0$ field, in order to polarize nuclear spins in an object under test.

Presently, it is known to make the coils forming the superconducting magnet from metals that exhibit the property of superconduction at very low temperatures. To achieve superconduction, the superconducting magnet is therefore cooled to the very low temperatures. One known cryogen-cooled superconducting magnet unit includes a cryostat including a cryogen vessel. A cooled superconducting magnet is provided within the cryogen vessel, the cryogen vessel being retained within an outer vacuum chamber (OVC). One or more thermal radiation shields are provided in a vacuum space between the cryogen vessel and the OVC. In some known arrangements, a refrigerator is mounted in a refrigerator sock located in a turret towards the side of the cryostat, the refrigerator being provided for the purpose of maintaining the temperature of a cryogen provided in the cryogen vessel. The refrigerator also serves sometimes to cool one of the radiation shields. The refrigerator can be a two-stage refrigerator, a first cooling stage being thermally linked to the radiation shield in order to provide cooling to a first temperature, typically in the region of 80-100K. A second cooling stage provides cooling of the cryogen gas to a much lower temperature, typically in the region of 4-10K.

During manufacture of the superconducting magnet, at maintenance intervals and/or when installing the superconducting magnet, it is necessary to energize the superconducting magnet to generate the static magnetic field mentioned above, typically using a Direct Current (DC) power supply. The power supply is therefore connected to the magnet coils forming the superconducting magnet via a so-called "Current Lead". The Current Lead is a pair of conductors, approximately 1 meter long, one end of which is at room temperature while the other is at about 4.2K. The design of the Current Lead is constrained by mutually exclusive properties of the Current Lead: electrical resistance and thermal conductivity. Consequently, design of the superconducting magnet is constrained by limitations associated with the Current Lead in the following ways.

Firstly, the Current Lead limits the maximum current at which the superconducting magnet can operate. In this respect, as the static magnetic field generated by the superconducting magnet is a function of the operating current of the superconducting magnet and/or the number of turns of superconducting wire used to form the coils, it therefore follows that if the superconducting magnet is energized using the maximum current allowed by the Current Lead, the number of turns of superconducting wire used must be relied upon in order to achieve a desired static field strength from the superconducting magnet. Reliance on the number of turns of superconducting wire used is, however, undesirable because the superconducting wire is costly and manufacturing process time is, in part, a function of the number of turns of the coils of the superconducting magnet that has to be provided during manufacture.

Furthermore, when the Current Lead is a so-called fixed Current Lead, i.e. a Current Lead that remains in place after the superconducting magnet has been energized, heat leak is known to occur through the persistent Current Leads. Since the maximum allowable heat leak from the superconducting magnet unit is limited by the refrigeration power of the refrigerator, the more heat leak that occurs through the fixed Current Lead, the less heat leak margin that is available for other parts of the superconducting magnet unit. From a design perspective, the amount of heat leak that can therefore be tolerated from other parts of the superconducting magnet unit, for example suspension components of the superconducting magnet unit, is limited. The use of more thermally efficient materials for the other parts of the superconducting magnet unit is therefore necessitated and this is costly, because whilst, in some cases, the cost of the materials is low, complexity of fitting the materials can be high.

It is also known to use a so-called demountable Current Lead, i.e. a Current Lead that is only connected to the superconducting magnet during charging. An advantage of using the demountable Current Lead is that heat leak is minimized. However, the minimization of the heat leak is at the expense of providing access to a connector arrangement to connect the demountable Current Leads to the superconducting magnet and hence the need to expose the superconducting magnet to atmosphere. Consequently, problems arise when trying to connect the demountable Current Lead to the superconducting magnet due to formation of ice in the connector arrangement provided. Formation of ice within the superconducting magnet unit as a result of the superconducting magnet being exposed to atmosphere is an even greater and particularly costly problem associated with the use of the demountable Current Lead, because the ice formed influences interaction between the coils of the superconductive magnet and a supporting former of the coils resulting in the superconductive magnet being unable to achieve a desired operating field. In more extreme cases, the ice can block the exit of the cryogen with undesirable effects.

Use of High-Temperature Superconductor (HTS) Current Leads has also been suggested as an alternative solution for providing leads to enable the superconducting magnet to be energized, the HTS Current Lead remaining in place after charging the superconducting magnet. In this respect, the cross-sectional area of an HTS Current Lead is less than the respective cross-sectional areas of the conventional fixed and demountable Current Leads described above. Consequently, the HTS Current Leads exhibit less heat leak when in use. However, as the HTS Current Leads are formed from a superconducting material, the use of the HTS Current Leads introduces a risk of the HTS material forming the Current Lead "quenching", if the current flowing through the HTS Current Leads results in the so-called "critical surface" (characterizing the superconducting material from which the HTS Current Leads are formed) being reached or exceeded. When quenching occurs in one or both of the HTS Current Leads, the energy used to energize the superconducting magnet is dissipated as heat.

In this respect, any heating in the HTS Current Lead (or indeed the non-superconductive leads described above) can result in heating of the superconductive magnet and so part of the superconductive magnet can cease to exhibit the property of superconduction and ohmic heating in the superconducting magnet takes place. The ohmic heating causes so-called "boil-off" of the cryogen used. Boil-off is undesirable as the cryogen is wasted if no recovery system is in place, the cryogen being an expensive commodity.

SUMMARY OF THE INVENTION

An object of the present invention is to provide a coil energization apparatus for a superconducting magnet, and a method for energizing such a coil, wherein energization efficiency is improved.

This object is achieved in accordance with the present invention by a method and arrangement for introducing current into a superconducting magnet having a superconducting switch connected across terminals of the superconducting magnet, wherein a controlled switch is connected across the superconducting switch, the controlled switch, the controlled switch being configured to respond more rapidly to control signals than the superconducting switch. The controlled switch is controlled to be in an OFF state, and a progressively increasing continuous current is supplied to the terminals of the superconducting magnet, until a first limiting value is reached. A pulsed current is then applied to the terminals of the superconducting magnet, the pulses of the pulsed current being of a larger magnitude than the first limiting value. The controlled switch is controlled to be in an ON state when current is not flowing through the terminals. Once a desired current is flowing in the superconducting magnet, application of the pulsed current ceases, and the controlled switch is maintained in an ON state until the superconducting switch becomes superconducting. The controlled switch is then controlled to an OFF state, so that the current in the magnet flows through the current leads. The current flowing through the current leads is reduced so that an increasing current flows through the superconducting switch.

According to the present invention, a coil energization apparatus, a superconductive magnet apparatus and a method of energizing a coil are provided that exhibit improved energization efficiency, resulting in less current loss during energization of the coil, for example of a low-temperature superconductive magnet. Also, an operating current of the magnet is increased during the energization process and hence less superconducting wire is required to form coils that maintain the same $B_0$ field strength, thereby reducing materials costs and process time associated with manufacture of the superconductive magnet. Furthermore, it is possible to reduce the cross-sectional area of the current leads used to energize the magnet and so reduce heat leak through the current leads employed, thereby making use of fixed Current Leads more attractive. The availability of a greater heat leak margin thus also permits the use of cheaper, less thermally efficient, materials for certain parts of the superconductive magnet, for example the suspension components of the superconductive magnet. Additionally, it is possible to reduce current loss between completion of energization of the superconducting magnet and efficient conduction by a cryogenic switch. Also, by provision of the switching device in parallel with the superconductive magnet, it is possible to protect a Current Lead employed under various fault conditions, for example a power failure while energizing the superconductive magnet, without the need to quench the superconductive magnet.

At least one embodiment of the invention will now be described, as an example only, with reference to the accompanying drawings.

BRIEF DESCRIPTION OF THE DRAWINGS

FIGS. 3(a) to 3(e) are timing diagrams for energizing a superconductive magnet using the system of FIG. 2.

DESCRIPTION OF THE PREFERRED EMBODIMENTS

Figure 1:
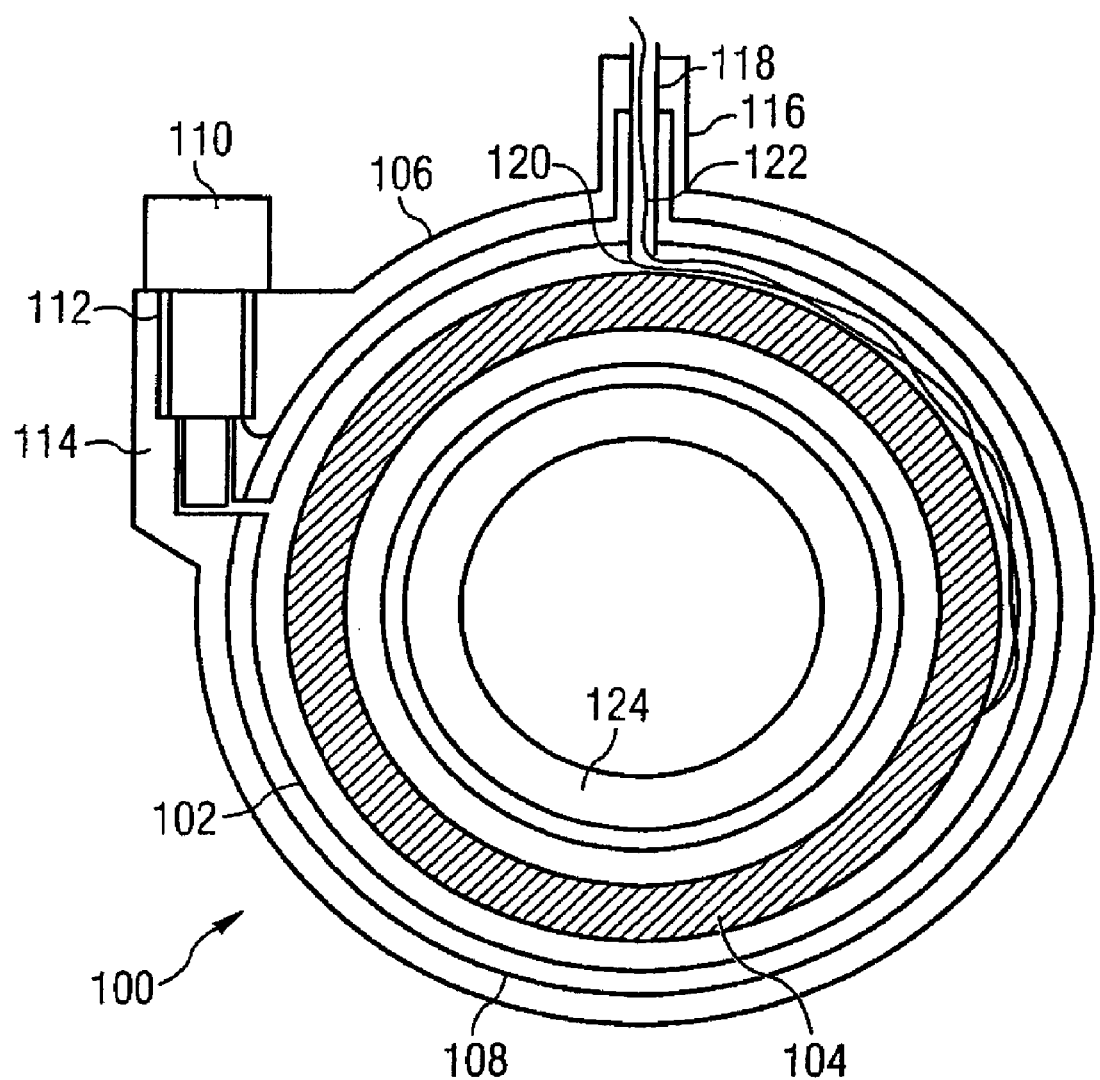
FIG. 1 is a schematic diagram of a superconducting magnet unit for coupling to a coil energization apparatus constituting an embodiment of the invention.

Throughout the following description identical reference numerals will be used to identify like parts.

Referring to FIG. 1, a tomography system, for example a Magnetic Resonance Imaging (MRI) system, comprises a superconductive magnet unit 100 having a cryostat including a cryogen vessel 102. A cooled superconductive magnet 104 is provided within the cryogen vessel 102, the cryogen vessel 102 being retained within an Outer Vacuum Chamber (OVC) 106. One or more thermal radiation shields 108 are provided in a vacuum space between the cryogen vessel 102 and the OVC 106. In this example, a refrigerator 110 is mounted in a refrigerator sock 112 located in a turret 114 towards the side of the cryostat, the refrigerator 110 being provided for the purpose of maintaining the temperature of a cryogen provided in the cryogen vessel 102. An access turret 116 is provided at the top of the cryostat, the access turret 116 retaining a vent tube 118 that serves as an access neck. The refrigerator 110 is, in this example, a two-stage refrigerator, a first cooling stage being thermally linked to the radiation shield 108 in order to provide cooling to a first temperature, typically in the region of 80-100K. A second cooling stage provides cooling of the cryogen to a much lower temperature, typically in the region of 4-10K. The cryogen used in this example is helium, but the skilled person will appreciate that other suitable cryogens can be employed.

A negative electrical connection 120 is provided to the superconductive magnet 104 through the body of the cryostat. A positive electrical connection 122, only schematically represented in FIG. 1, is provided by a conductor passing through the vent tube 118. In this example, a demountable Current Lead (not shown in FIG. 1) is used to couple a Direct Current (DC) power supply unit (also not shown in FIG. 1) to the negative and positive connections 120, 122. For fixed Current Lead designs, a separate, auxiliary, vent path (not shown in FIG. 1) is provided in the cryostat as a fail-safe vent in case of blockage of the vent tube 118.

A gradient coil system is also provided and comprises, in this example, three paired orthogonal gradient coils 124 disposed within the superconductive magnet 104 in order to produce gradient magnetic fields when in use.

Figure 2:
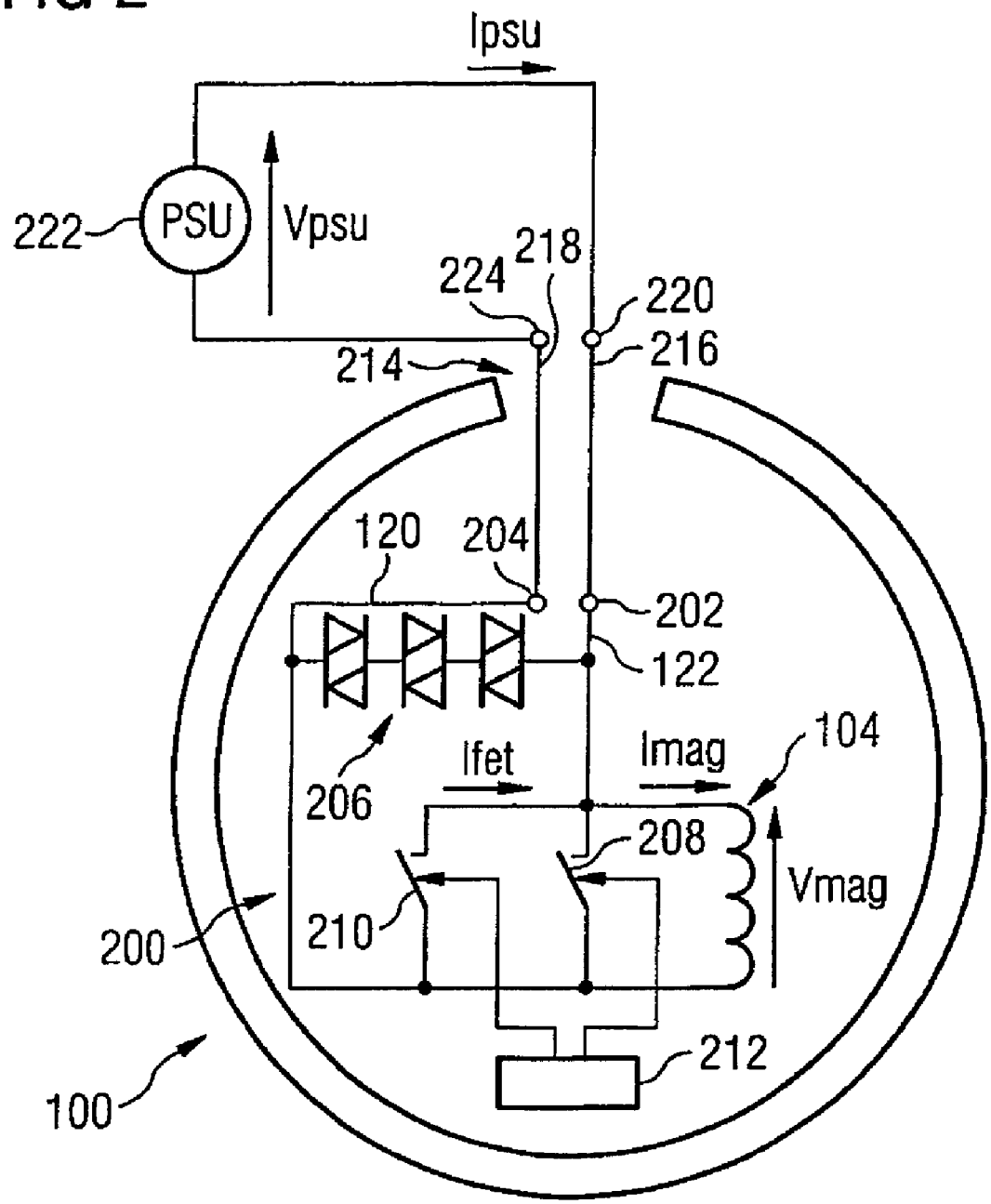
FIG. 2 is a schematic diagram of an energization system constituting an embodiment of the invention.

Referring to FIG. 2, a current flow control circuit apparatus 200 comprises a first positive lead terminal 202 and a first negative lead terminal 204, a first terminal of a bidirectional diode pack 206 being coupled to the first positive lead terminal 202 via the positive electrical connection 122 described above and a second terminal of the diode pack 206 being coupled to the first negative lead terminal 204 via the negative electrical connection 120 described above. The diode pack 206 is provided to protect a cryogenic switch 208. As the manner of protection provided by the diode pack 206 is known in the art, the protection provided need not be described further herein.

In this example, the cryogenic switch 208 is a heating element, or a plurality of series-coupled heating elements, disposed adjacent a coil formed from a superconducting material, for example a Niobium-Titanium alloy. The skilled person should, however, appreciate that any suitable arrangement can be provided to serve as the cryogenic switch 208 and capable of fulfilling the function associated with the cryogenic switch 208 described later herein. The cryogenic switch 208 has a latency, or delayed response, associated with actuation of the cryogenic switch 208 and, depending upon the arrangement employed, can be perceived as a response-delayed selective conduction device. In this example, the cryogenic switch 208 is an example of a temperature-dependent switching device.

Coils of the superconductive magnet 104 are coupled to the current flow control circuit apparatus 200. In this respect, a first terminal of the superconductive magnet 104 is coupled to the first positive lead terminal 202 and a second terminal of the superconductive magnet 104 is coupled to the first negative lead terminal 204. The cryogenic switch 208 is coupled in parallel with the superconductive magnet 104, and so a first terminal of the cryogenic switch 208 is coupled to the first positive lead terminal 202 and a second terminal of the cryogenic switch 208 is coupled to the first negative lead terminal 204.

Additionally, a Field Effect Transistor (FET) device 210 is coupled in parallel with the cryogenic switch 208 and so a first conduction terminal of the FET 210 is coupled to the first positive lead terminal 202 and a second conduction terminal of the FET 210 is coupled to the first negative lead terminal 204. FET 210 is schematically represented as a switch in FIG. 2. The skilled person should appreciate that although use of a field effect transistor is described herein, any suitable threshold-dependent conduction device can be employed and that the field effect transistor is one example of the threshold-dependent conduction device arrangement. Indeed, any suitable switching device can be employed, for example any suitable solid state device, the field effect transistor being one example of the solid state device. In this example, the FET 210 is implemented by way of 100 so-called "D2 Pak" (10 mm×15 mm) surface mount FETs on an A4 sized Printed Circuit Board (PCB). Implemented in this exemplary manner, the FET 210 typically drops 10 mV at 1000 A, dissipating 10 W of energy. Hence, energy loss is relatively small and acceptable on a temporary basis.

A processing resource, for example a controller 212, is operably coupled to a respective control terminal (not shown) of the cryogenic switch 208 and a respective control terminal, for example a gate terminal, of the FET 210 in order to coordinate, for example synchronize, actuation of the cryogenic switch 208 and/or the FET 210 in the manner described herein. In this example, a single controller is employed. However, the controller is simply an example of the processing resource and other suitable arrangements can be used. Indeed, control of the cryogenic switch 208 and the FET 210 need not be provided by a single functional element and responsibility for control of the cryogenic switch 208 and the FET 210 can be distributed over any appropriate number of processing elements.

The demountable Current Lead 214 comprises a first conductor 216 and a second conductor 218, a first end of the first conductor 216 being coupleable to the first positive lead terminal 202 and a first end of the second conductor 218 being coupleable to the first negative lead terminal 204. Although not shown, a coupling, for example a plug and socket arrangement, is provided in order to achieve temporary coupling of the demountable Current Lead 214 to the lead terminals 202, 204. It should be appreciated that reference herein to "conductors" in relation to Current Leads should not necessarily be interpreted as implying any particular degree of flexibility. Indeed, the "conductors" can be, for example, rigid, resiliently deformable, or flexible to any necessary degree.

A second end of the first conductor 216 is coupled to a positive output terminal 220 of the power supply unit 222 and a second end of the second conductor 218 is coupled to negative output terminal 224 of the power supply unit 222. Again, although not shown, another coupling, for example another plug and socket arrangement, is provided in order to achieve temporary coupling of the demountable Current Lead 214 to the output terminals 220, 224 of the power supply unit 222.

In operation, the demountable Current Lead 214 is coupled at the second end thereof to the output terminals 220, 224 of the power supply unit 222 and at the first end thereof to the positive and negative lead terminals 202, 204 in order to couple electrically the power supply unit 222 to the current flow control circuit apparatus 200 and the superconductive magnet 104.

Turning to FIG. 3, in particular FIGS. 3(*a*) and 3(*b*), the power supply 222, by virtue of a current source (not shown) thereof, provides an output current signal 300 over an energization period for energizing the superconductive magnet 104. In FIG. 3(*a*), Vpsu shows the output voltage of the power supply unit 222, and Vmag shows the voltage across the magnet coils. In FIG. 3(*b*), Ipsu shows the current supplied by the power supply unit, and Icryo shows the current flowing through the cryogenic switch 208. In this respect, from an initial current of 0 A, the output current signal is continuously incremented at a nominal voltage 302, for example between about 2 volts and about 20 volts, such as about 10 volts, over a first duration 304 in order that the output current signal constitutes a continuous incrementing current signal 306 until a maximum operating current of the demountable Current Lead 214 is reached. The maximum operating current of a given Current Lead is dictated by a number of factors, including electrical conductivity of the material from which the given Current Lead is formed, cross sectional area of the given Current Lead, and temperature coefficient of the material, a thermal time constant of the Current Lead being a function of the material from which the Current Lead is formed and the cross-sectional area of the Current Lead. The maximum operating current of the Current Lead is rated by the manufacturer of the demountable Current Lead 214 and so the power supply unit 222 can be configured by an engineer, charged with the task of energizing the superconductive magnet 104, to respect the maximum operating current of the Current Lead 214. The process of supplying electrical current to the coils of the superconductive magnet 104 in this manner is known as "ramping".

During the first duration 304, the FET 210 is in an "off" state (FIG. 3(*d*)), i.e. is not actuated, and the cryogenic switch 208 is open (FIG. 3(*e*)), i.e. constitutes a resistance in the circuit, and so does not conduct electricity. Consequently, the output current signal serves to energize the coils of the superconductive magnet 104.

However, once the maximum operating current of the Current Lead 214 has been reached, the output current signal is pulsed (FIG. 3(*b*)) by the power supply unit 222 over a second duration 308 in order that the output current signal constitutes a pulsed output current signal 310. In this example, each pulse has a respective duration of 1 second, though the duration can be longer provided the duration is less than the thermal time constant of the Current Lead. A duty cycle of the pulse output current signal 310 is controlled by the power supply unit 222 so that a Root Mean Square (RMS) value of the pulsed output current signal 310 does not exceed a maximum RMS operating current of the Current Lead 214. The duty cycle and amplitude of the pulses generated by the PSU 222 is configurable through the provision of suitable controls (not shown). Those skilled in the art will appreciate that the RMS value of the operating current is only one example of a predetermined average operating parameter not to be exceeded. In this respect, the predetermined average operating parameter can be a predetermined average operating current and/or correspond to a mean power dissipation in the Current Lead.

During the second duration 308, the cryogenic switch 208 remains open. During periods when the power supply unit 222 is not providing current, for example between pulses, the FET 210 is actuated (FIG. 3(d)) so that the FET 210 conducts electricity in order to maintain the flow of electrical current around the coils of the superconductive magnet 104, thereby minimizing loss of charge by the superconductive magnet 104.

To further demonstrate the principle of controlling the RMS operating current with respect to the Current Lead 214, over a third duration 312, the amplitude of the current pulses is increased, but the duty cycle of the output current signal is reduced in order to ensure that the RMS value of the output current signal does not exceed the maximum RMS operating current of the Current Lead 214. In this example, pulses, 1 second in duration, are separated by a duration of 3 seconds.

Again, during the third duration 312, the cryogenic switch 208 remains open, but during periods when the power supply unit 222 is not providing current, for example between pulses, the FET 210 is actuated so that the FET conducts electricity in order to maintain the flow of electrical current around the coils of the superconductive magnet 104, thereby minimizing loss of charge by the superconductive magnet 104. Since the inter-pulse duration has been increased, the duration of the periods when the FET 210 is in the conducting state is correspondingly increased.

For illustrative purposes, a fourth duration 314 of FIG. 3 contains a single 1 second pulse 316 having a rising edge 318 and corresponding rise-time of 0.1 second. The single pulse 316 also has a falling edge 320 having a corresponding fall-time of 0.1 second. The single pulse 316 is an example of the pulses that can be employed in the pulsed output current signal 310, which comprises a plurality of pulses.

Once an operating current of the superconductive magnet 104 is reached, for example between about 300 A and about 700 A, the operating current corresponding to the superconductive magnet 104 being capable of generating, in this example, a desired static magnetic field for tomography purposes, the FET 210 is actuated so that the FET 210 is in a conductive state 322 over a temporary period 326. Closure 324 of the cryogenic switch 208 is then, subsequently, commenced. While the cryogenic switch 208 is a more efficient device than the FET 210 for closing the circuit of the superconductive magnet 104 in order to maintain the flow of electrical current around the coils of the superconductive magnet 104 until energization of the superconductive magnet 104 is next required, the cryogenic switch 208 does not conduct instantaneously. Nevertheless, the conduction of the FET 210 serves as a temporary measure and closes the circuit of the coils of the superconductive magnet 104 whilst the cryogenic switch 208 cools over an associated cooling period 328, the cryogenic switch 208 reaching an optimum level of efficiency, i.e. when superconductivity is exhibited, when cooled to a temperature at which the superconductive material from which part of the cryogenic switch 208 is formed is known to be superconductive. The temporary period 326 commences before and overlaps with the cooling period 328. By virtue of the temporary provision of a conductive path through the FET 210 whilst the cryogenic switch 208 is cooling, loss of charge by the superconductive magnet 104 is minimized. Once the cryogenic switch 208 is closed, the time taken to close being known from a performance characteristic of the cryogenic switch 208, the power supply unit 222 supplies a current resulting in the current flowing through the FET 210 reducing to 0 A and hence the voltage across the FET 210 and the cryogenic switch 208 is 0V. The current supplied by the power supply unit 222 is then decreased over a fifth period 330, during which the current in the superconducting magnet 104 increasingly flows through the cryogenic switch 208. Once the current provided by the power supply unit reaches 0 A, the power supply unit 222 is disconnected from superconductive magnet 104 and removed.

Although in the above examples reference has been made to a demountable Current Lead, those skilled in the art will appreciate that use of other types of electrical conductor is contemplated, for example a permanent Current Lead.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for introducing current into a superconducting magnet having a superconducting switch connected across terminals of the superconducting magnet, said terminals being connected to current leads having a first current limiting value associated therewith, the method comprising the steps of:

connecting a controlled switch across the superconducting switch, the controlled switch being selected to respond more rapidly to control signals than the superconducting switch;

controlling the controlled switch to be in an OFF state;

applying a progressively increasing continuous current through said current leads into the superconducting magnet, until said first limiting value is reached;

applying a pulsed current through in pulses the current leads to the magnet, at least some of the pulses of the pulsed current exceeding the first limiting value, and the controlled switch is controlled to be in an ON state when current is not flowing through the current leads;

once a desired current is flowing in the superconducting magnet, ceasing application of the pulsed current and maintaining the controlled switch in an ON state until the superconducting switch becomes superconducting;

controlling the controlled switch to an OFF state, such that the current in the magnet flows through the current leads; and reducing the current flowing in the current leads such that increasing current flows through the superconducting switch.

2. A method as claimed in claim 1, wherein the pulsed output current signal comprises a plurality of pulses, a duration of a pulse of the plurality of pulses being less than a predetermined thermal time constant of the current leads.

3. A method as claimed in claim 1, wherein the pulsed output current signal has a duty cycle associated therewith, the duty cycle being arranged so that a predetermined average operating parameter is not exceeded.

4. A method as claimed in claim 1 comprising automatically selectively actuating the switching device.

5. A method as claimed in claim 4, comprising automatically actuating the switching device dependent on a threshold.

6. A method as claimed in claim 4 comprising employing a solid-state device as the switching device.

7. A method as claimed in claim 6 comprising employing a field effect transistor as the switching device.

8. An arrangement for introducing current into a superconducting magnet having a superconducting switch connected across terminals of the superconducting magnet, said terminals being connected to current leads having a first current limiting value associated therewith, said arrangement comprising:

a controlled switch across the superconducting switch, the controlled switch being selected to respond more rapidly to control signals than the superconducting switch; and a controller configured to control the controlled switch to be in an OFF state, apply a progressively increasing continuous current through said current leads into the superconducting magnet, until said first limiting value is reached, and to apply a pulsed current in pulse through the current leads to the magnet, at least some of the pulses of the pulsed current exceeding the first limiting value, and to control the controlled switch is to be in an ON state when current is not flowing through the current leads, once a desired current is flowing in the superconducting magnet, and to cease application of the pulsed current and to maintain the controlled switch in an ON state until the superconducting switch becomes superconducting, and to control the controlled switch to an OFF state, such that the current in the magnet flows through the current leads, and to reduce the current flowing in the current leads such that increasing current flows through the superconducting switch.

* * * * *